(12) United States Patent
Yang et al.

(10) Patent No.: US 8,647,987 B2
(45) Date of Patent: Feb. 11, 2014

(54) METHOD FOR IMPROVING UNIFORMITY OF CHEMICAL-MECHANICAL PLANARIZATION PROCESS

(75) Inventors: Tao Yang, Beijing (CN); Chao Zhao, Kessel-lo (BE); Junfeng Li, Beijing (CN)

(73) Assignee: The Institute of Microelectronics, Chinese Academy of Science, Beijing (CN)

( * ) Notice: Subject to any disclaimer, the term of this patent is extended or adjusted under 35 U.S.C. 154(b) by 0 days.

(21) Appl. No.: 13/698,283

(22) PCT Filed: Jun. 12, 2012

(86) PCT No.: PCT/CN2012/000802
§ 371 (c)(1),
(2), (4) Date: Nov. 16, 2012

(87) PCT Pub. No.: WO2013/155650
PCT Pub. Date: Oct. 24, 2013

(65) Prior Publication Data
US 2013/0273669 A1    Oct. 17, 2013

(51) Int. Cl.
*H01L 21/302* (2006.01)
*H01L 21/461* (2006.01)
*H01L 21/311* (2006.01)

(52) U.S. Cl.
USPC ............ 438/692; 438/694; 438/697; 438/699

(58) Field of Classification Search
USPC ......... 438/689, 690, 691, 692, 694, 695, 697, 438/699
See application file for complete search history.

(56) References Cited

U.S. PATENT DOCUMENTS

| 5,494,854 | A * | 2/1996 | Jain | 438/692 |
| 7,750,470 | B2 * | 7/2010 | Hsieh et al. | 257/750 |
| 2005/0153519 | A1 * | 7/2005 | Lu et al. | 438/424 |
| 2010/0270618 | A1 * | 10/2010 | Takei et al. | 257/352 |
| 2012/0292748 | A1 | 11/2012 | Sadaka et al. | |

FOREIGN PATENT DOCUMENTS

| CN | 1618569 A | 5/2005 |
| CN | 101842871 A | 9/2010 |
| RU | 2436188 C1 | 12/2011 |

* cited by examiner

*Primary Examiner* — Mary Wilczewski
*Assistant Examiner* — Erik T Peterson
(74) *Attorney, Agent, or Firm* — Treasure IP Group

(57) ABSTRACT

The invention provides a method for improving uniformity of chemical-mechanical planarization process, comprising the steps of: forming features on a substrate; forming a first dielectric isolation layer between the features; planarizing the first dielectric isolation layer until the features are exposed, causing the first dielectric isolation layer between the features to have a recess depth; forming a second dielectric isolation layer on the features and the first dielectric isolation layer, whereby reducing the difference in height between the second dielectric isolation layer between the features and the second dielectric isolation layer on the top of the features; planarizing the second dielectric isolation layer until the features are exposed. According to the method for improving uniformity of chemical-mechanical planarization process of the invention, a dielectric isolation layer is formed again after grinding the dielectric isolation layer on the top of the features, such that the difference in height between the dielectric layer between the features and the dielectric layer on the top of the features is effectively reduced, and the recess of the features is compensated, the within-in-die uniformity is effectively improved.

17 Claims, 2 Drawing Sheets

METHOD FOR IMPROVING UNIFORMITY OF CHEMICAL-MECHANICAL PLANARIZATION PROCESS

CROSS REFERENCE

This application is a National Phase application of, and claims priority to, PCT Application No. PCT/CN2012/000802, filed on Jun. 12, 2012, entitled "A Method for improving Uniformity of Chemical-Mechanical Planarization Process'", which claimed priority to Chinese Application No. CN 201210112494.3, filed on Apr. 16, 2012. Both the PCT Application and Chinese Application are incorporated herein by reference in their entireties.

FIELD OF THE INVENTION

The invention relates to a manufacturing method of semiconductor devices, and more specifically, relates to a method for improving uniformity of chemical-mechanical planarization process.

BACKGROUND OF THE INVENTION

The successful application of high-K/metal gate engineering on the 45 nm technology node has made it essential and key modular engineering for technology nodes below sub-30 nm. The high-K/metal gate is divided into gate-first process and gate-last process. Since the gate-last process avoids the negative influence of ion implantation and high-temperature annealing upon the high-K/metal gate work function, currently it has become the mainstream process. At present, only Intel Corporation who pursued the high-K/gate-last route has achieved success in 45 nm and 32 nm mass production. In recent years, the giants in the industry such as Samsung, TSMC, Infineon and so on who closely follow the IBM Industry Alliance have also switched the previous development focus from the high-K/gate-first to the high-K/gate-last engineering.

The development of the chemical-mechanical planarization (CMP) process in the gate-last process integration is regarded to be the most challenging in the industry. In the conventional gate-last process, it needs the following steps: a silicon oxide isolation layer 4 and a silicon nitride isolation layer 3 on the top of polysilicon gates 2 on the substrate 1 are to ground off by the CMP process, and the grinding is not stopped until the top of the polysilicon gates 2 is exposed, the step of CMP process is called Poly opening nitride polish CMP, referred to as POP CMP for short, as shown in FIGS. 1A and 1B. Then, the polysilicon gates are removed, and the resulting trench is filled with a different metal layer 5, and then chemical-mechanical polishing is performed to the metal layer in one or more steps, the step of CMP process is the metal gate CMP, such that only the metal in the gate is left, thereby high-K/metal gate structures are ultimately obtained, as shown in FIGS. 2A and 2B.

The first POP CMP comprises a two-step CMP, one is silicon oxide CMP, and the other is silicon nitride CMP. A very high within-in-die uniformity is required for each of the two-step CMP. The control over the grinding uniformity of silicon oxide CMP process is the most critical. Due to a relatively high device density, and height differences among gates which exist before deposition of the silicon oxide layer 4, which are approximately 1000-1800 Å, the thickness differences between the silicon oxide layer on the source/drain regions and the tops of the polysilicon gates after silicon oxide deposition can reach about 1000-4000 Å or even more, as shown in FIG. 1A. As technology nodes continuously decrease in size, the conventional CMP meet with extremely high challenge in terms of improving the within-in-die uniformity for technology nodes below 45 nm. Besides innovation of the hardware configuration of the equipment used, selecting appropriate grinding slurry and grinding pad is an effective method of improving the within-in-die uniformity. Since this relates to the technical secret of respective corporations, currently there are few published documents or patent reports. If the conventional silicon oxide CMP process is employed, such great thickness differences cannot be effectively eliminated, which will be kept with the implementation of the polishing procedure until the silicon oxide polishing ends, causing large to recess to exist in the silicon oxide between polysilicon gates. Even the next step silicon nitride CMP hardly can repair it, and due to the difference in material selectivity, such silicon oxide recess may be further enlarged, as shown in FIG. 1B, the silicon oxide between gates has a first recess depth H1 which is, e.g., about 100 Å. A large recess of the silicon oxide layer 4 will directly cause a great obstacle to the metal gate CMP process, it will drastically limit the tuning range of the process. As shown in FIGS. 2A and 2B, the metal layer 5 is filled in the gate trench and meanwhile is remained in the recess of the silicon oxide layer 4 between the gates, causing a short-circuit of the device during the subsequent metal gate CMP. Likewise, as far as other features which demand for the planarization processing are concerned, such as the fin structure, the multi-gate structure, the MEMS structure and etc., they also have the similar problem, the recess of the dielectric isolation layer between the features will be kept and enlarged in the subsequent processing course, resulting in failure of the features.

Therefore, it urgently needs a method for effectively improving within-in-die uniformity directed for the POP CMP process.

SUMMARY OF THE INVENTION

Thus, the purpose of the invention lies in proposing a method for improving the within-in-die uniformity, and in particular effectively improving the uniformity of the subsequent metal gate CMP for the POP CMP process.

The invention provides a method for improving uniformity of chemical-mechanical planarization process, comprising the steps of: forming features on a substrate; forming a first dielectric isolation layer between the features; planarizing the first dielectric isolation layer until the features are exposed, causing the first dielectric isolation layer between the features to have a recess depth; forming a second dielectric isolation layer on the features and the first dielectric isolation layer, at least refilling the recess of dielectric isolation layer caused by the first chemical-mechanical planarization, whereby reducing the difference in is height between the second dielectric isolation layer between the features and the second dielectric isolation layer on the top of the features; and planarizing the second dielectric isolation layer until the features are exposed.

The second dielectric isolation layer is of the same material as the first dielectric isolation layer.

In one embodiment of the present invention, after the step of planarizing the first dielectric isolation layer, and before forming the second dielectric isolation layer, the method further comprises the step of: etching the first dielectric isolation layer, whereby increasing the recess depth of the first dielectric isolation layer. In one example, the first dielectric isolation layer is etched by dry etching and/or wet etching.

In another embodiment of the present invention, the method further comprises: after forming the features and before forming the first dielectric isolation layer, further forming a feature protection layer on the top and sidewalls of the features. And the step of planarizing the first dielectric isolation layer further comprises, planarizing the first dielectric isolation layer until the feature protection layer on the top of the features is exposed; and planarizing the feature protection layer on the top of the features until the features are exposed.

In another embodiment of the present invention, the features comprise one of semiconductor material, insulating material and conductive material, the semiconductor material comprises one of polycrystalline silicon, amorphous silicon and microcrystalline silicon, or combinations thereof, the insulating material comprises one of silicon oxide, silicon nitride, silicon oxynitride and high-k material, or combinations thereof, and the conductive material comprises one of metal, metal alloy and metal nitride, or combinations thereof.

In another embodiment of the present invention, the first dielectric isolation layer, the second dielectric isolation layer and the feature protection layer comprise one of oxide, nitride and oxynitride, or combinations thereof.

In still another embodiment of the present invention, when the CMP planarization is employed, the grinding is automatically stopped by an endpoint detection system carried by the CMP device, or the grinding is stopped by controlling the grinding time.

According to the method for improving uniformity of chemical-mechanical planarization process of the invention, a dielectric isolation layer is formed again after grinding the dielectric isolation layer on the top of the features, such that the difference in height between the dielectric layer between the features and the dielectric layer on the top of the features is effectively reduced, and the recess of the dielectric layer between the features is compensated, hence, the within-in-die uniformity is effectively improved.

BRIEF DESCRIPTION OF THE DRAWINGS

In the following text, the technical solution of the invention is stated in detail with reference to the Figures.

DETAILED DESCRIPTION OF THE EMBODIMENTS

Figure 1A:
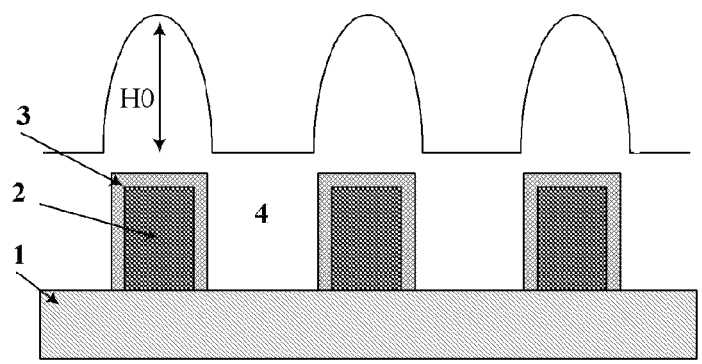
FIGS. 1A and 1B show sectional views of the gate-last process of the prior art, wherein CMP is implemented upon the silicon oxide layer until the dummy gates are exposed.
Figure 1B:
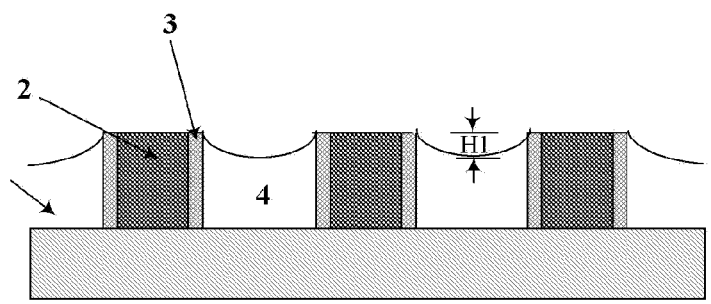
Figure 2A:
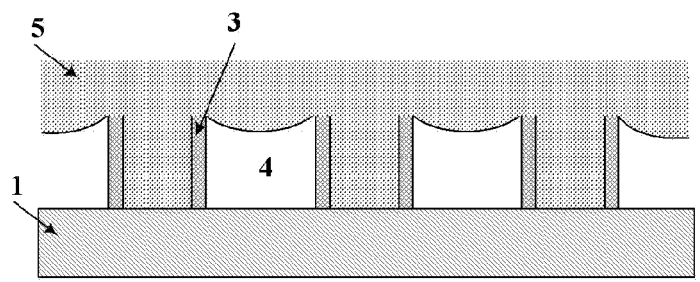
FIGS. 2A and 2B show sectional views of the gate-last process of the prior art, wherein metal gates are filled after the dummy gates are removed and CMP is implemented until the silicon nitride layer is exposed.
Figure 2B:
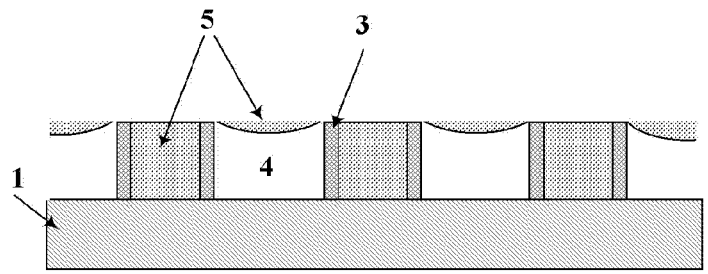

In the following text, the features and technical effects of the technical solution of the invention are expounded with reference to the Figures in combination with the illustrative embodiments, and the method for improving the uniformity of chemical-mechanical planarization process is disclosed. It needs to be pointed out that similar reference signs represent similar structures.

In the POP CMP process, the recess of a dielectric isolation layer formed of, e.g., silicon oxide, which is generated between the features of, e.g., polysilicon gates, substantively is caused by the height difference between the structure and the portion between the features, e.g., source/drain regions; that is, after a dielectric isolation layer is grown, the dielectric isolation layer on the top of the features is higher than that between the features, which is unfavorable to the control of the recess of the dielectric isolation layer between the features in the CMP process. The designing idea of the application is to perform a first CMP planarization and a second growth of the dielectric layer, by which the recess of the dielectric isolation layer is repaired and the difference in height between the dielectric isolation layer on the top of the features and the dielectric isolation layer between the features is largely reduced, and to perform a second CMP planarization to obtain a structure of features. The method may effectively improve the within-in-die uniformity.

Firstly, features and a first dielectric isolation layer between the features are formed, and planarization processing is implemented, for example, the prior POP CMP process is carried out, the dielectric isolation layer between the features has a recess depth. A substrate 1 is provided, various substrate materials may be employed according to the demand of the electrical performance of the device, which, for example, comprise one of silicon, silicon-on-insulator (SOI), monocrystalline germanium, germanium-on-insulator (GeOI), nano-wire and other compound semiconductor materials such as SiGe, SiC, InSb, GaAs, GaN and so on. Features 2 are formed on the substrate 1, the features 2 comprise but are not limited to a dummy gate, a fin structure formed of the substrate material, a beam structure made from the MEMS process, a hard mask intermediate structure in the etching process, a raised structure formed by epitaxial growth and so on. The material of the features 2 comprises but is not limited to a semiconductor material, an insulating material and a conductive material; the semiconductor material, for example, is one of polysilicon, amorphous silicon and microcrystalline silicon, or combinations thereof, for use of the dummy gates or fin-shaped structures, the insulating material, for example, is one of silicon oxide, silicon nitride, silicon oxynitride and high-K material, or combinations thereof, and the conductive material, for example, is one of metal, metal alloy and metal nitride, or combinations thereof, so as to be applied to the metal gates or metal contact plug wires and so on. Preferably, the features 2 are dummy gates for use of the gate-last process, which are formed of one of polysilicon, amorphous silicon and microcrystalline silicon, or combinations thereof. The method of forming the features 2 may be selected among various conventional deposition methods such as APCVD, LPCVD, PECVD, HDPCVD, MOCVD, ALD, sputtering and so on according to the difference in the material thereof. By the conventional method of firstly depositing and then performing photography/etching, a feature protection layer 3 is deposited on the top and sides of the features 2 by the similar conventional method, the material of the feature protection layer 3, for example, is silicon nitride or silicon oxynitride, having a relatively high rigidity and a relatively good etching selectivity, and preferably having a relatively large stress, such that it is adapted to applying stress to the substrate to promote the carrier mobility in the channel region of a device such as MOSFET and so on. A first dielectric isolation layer 4 is deposited on the entire device, the material thereof, for example, is silicon oxide or silicon oxynitride. After the dielectric isolation layer is deposited, a first grinding slurry specific to the first dielectric isolation layer 4 formed of an oxide is used to implement the first chemical-mechanical planarization process upon the entire wafer (i.e. oxide CMP). When the feature protection layer 3 on the top of the structure is exposed, the grinding is automatically stopped by an endpoint detection system by means of friction or optics, which is carried by a CMP device. Then, a second grinding slurry specific to the feature protection layer 3 formed of a nitride is used to implement the second chemical-mechanical planarization process upon the entire wafer (i.e. nitride CMP). The feature protection layer 3 formed of the silicon nitride material on the top of the features 2 is ground off, meanwhile, a portion of the first dielectric isolation layer 4 formed of the silicon oxide material is correspondingly ground off; this step of CMP is carried out by endpoint detection or grinding time control. After the grinding is carried out, the feature protection layer 3 is remained on the sides of the features 2, the first dielectric isolation layer 4 between the features 2 recesses and to thus is lower than the features 2, the height of the features 2, for example, is about 1000 Å, the first recess depth H1 of the first dielectric isolation layer 4, for example, is about 100 Å.

Optionally, oxide recess processing is implemented upon the first dielectric isolation layer 4, such that the first dielectric isolation layer 4 between the features 2 has a second recess depth H2, deeper than the first recess depth.

Figure 3:
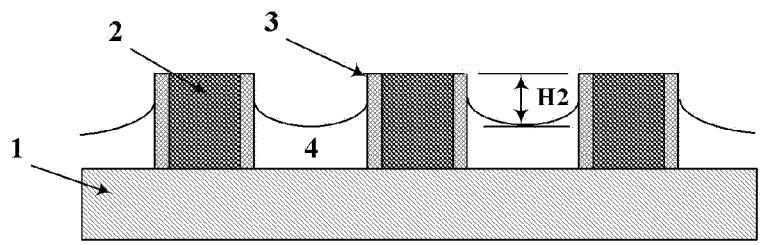
FIGS. 3-5 schematically illustrates the sectional views of each step of the method sequentially, according to the aspects of the present invention.

There are three methods that may carry out the step of oxide recess processing, which are as follows:

(1) The first dielectric isolation layer 4 is etched by directly dry etching the entire wafer. In the etching process, the first dielectric isolation layer 4 between the features 2 is recess-etched by using an etching gas having a high selectivity (i.e., the rate of etching the features 2 and the feature protection layer 3 is low, while the rate of etching the dielectric isolation layer 4 is fast) and by controlling the etching time; after the dielectric isolation layer 4 between the features 2 is recess-etched, a structure as shown in FIG. 3 is obtained. The etching gas may comprise fluoride-containing gas such as fluorocarbon-based gas ($C_xH_yF_z$), $NF_3$, $SF_6$, $XeF_2$, $BrF_2$ and so on, and other halogen-containing gas such as $Cl_2$, $Br_2$, HBr, HCl and so on, and also may comprise oxidizing agent such as oxygen, ozone, oxynitride and so on. A high etching selectivity may be ensured by controlling the ratio of respective components of the mixed etching gas.

(2) The first dielectric isolation layer 4 is etched by directly wet etching the entire wafer. In the etching process, the dielectric isolation layer 4 between the features 2 is recess-etched by using an etching chemical liquid having a high selectivity (i.e., the rate of etching the features 2 and the feature protection layer 3 is low, while the rate of etching the dielectric isolation layer 4 is fast) and by controlling the etching time and temperature; after the dielectric isolation layer 4 between the features 2 is recess-etched, a structure as shown in FIG. 3 is obtained. in the case that the first dielectric isolation layer 4 is formed of silicon oxide material, the is etching chemical liquid may comprise diluted hydrofluoric acid (DHF, e.g. 2.5 volume % HF solution) and buffered oxide etcher (BOE, a mixed solution in which the ratio of $NH_4F$ to HF is 1:4), the etching temperature, for example, is about 25° C.

(3) The first dielectric isolation layer 4 between the features 2 is recess-etched by using the aforesaid processes of mixed dry and wet etching and by controlling the etching time; for example, firstly dry etching and then wet etching is implemented.

Figure 4:
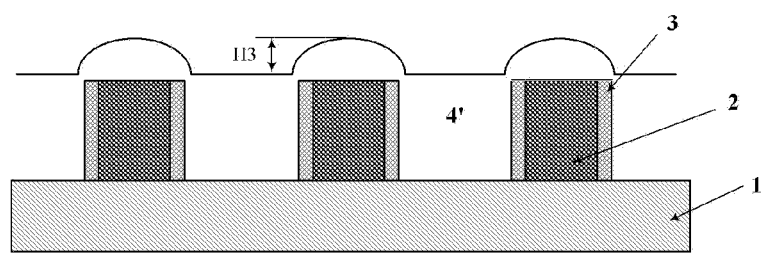

After the recess-etching for the first dielectric isolation layer 4 between the features 2 is carried out, the first dielectric isolation layer 4 has a second recess depth H2, e.g., about 400 Å, which is greater than the first recess depth. The recess-etching may effectively remove the first dielectric insulation layer 4 on the top of the feature protection layer 3 so as to further increase the local height difference between the dielectric isolation layer on the top of the features and the dielectric isolation layer between the features when another dielectric isolation layer is grown. Because there is no first dielectric isolation layer 4 at the upper end portion of the sidewalls of the feature protection layer 3, a relatively large height difference can be obtained untilizing the selective characteristic of the growth of oxide, when subsequently growing the second dielectric isolation layer 4', facilitating the CMP processing. Naturally, if, after the POP CMP processing, the first recess depth of the first dielectric isolation layer 4 per se is large enough to result that there is no first dielectric isolation layer 4 at the upper end portion of the sidewalls of the feature to protection layer 3, for example, the first recess depth substantially reaches or exceeds the second recess depth, the aforesaid recess-etching processing may be omitted. Then, see FIG. 4, the second dielectric isolation layer 4' is formed on the entire device, such that the second dielectric isolation layer 4' on the top of the features has a protruding depth. Like the process and material of previously forming the dielectric isolation layer 4, the second dielectric isolation layer 4' is deposited on the top of the features 2 and in the recess between the features 2, ultimately causing the recess of the first dielectric isolation layer 4 between the features 2 to be completely filled and to be higher than the recess region, and meanwhile causing the second dielectric layer 4' on the top of the features 2 to have a height H3 higher than the features 2, the H3 is, e.g., about 400 Å, the H3 is much smaller than the height H0 in FIG. 1A, for example, it is only ⅕-⅓ as high as the height H0 in FIG. 1A. The formed second dielectric isolation layer 4' may be of the same material as the previous first dielectric isolation layer 4, and also may be different and thus form a laminated structure. Preferably, the two are of the same material to save the process and reduce the manufacturing cost. The purpose of the second re-deposition of the dielectric isolation layer lies in repairing the recess between the features, repairing the damage to the top angle of the feature protection layer 3 that may be caused in the CMP process, and obtaining a relatively small thickness difference between the dielectric on the top of the features and the dielectric between the features.

Figure 5:
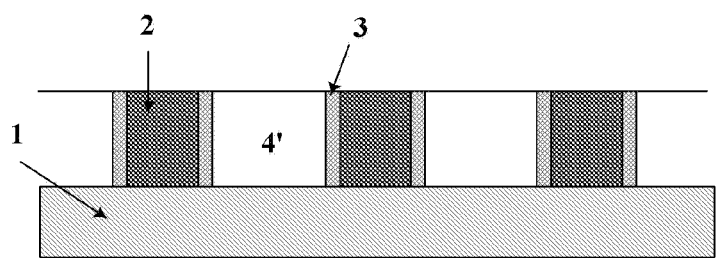

Finally, see FIG. 5, the planarization processing is implemented again upon the second dielectric isolation layer 4'. The wafer is processed by CMP, appropriate grinding slurry and grinding pad are selected for the second dielectric isolation layer 4' which is formed of the oxide material. When the features 2 are exposed, the grinding is automatically stopped by the endpoint detection system carried by the CMP device. The finally to obtained structure is shown in FIG. 5. There are a plurality of features 2 on the substrate 1, there is a feature protection layer 3 on the sidewalls of the features 2, there is a dielectric isolation layer 4/4' between the features 2, wherein the top of the dielectric isolation layer 4/4' is substantially flush with the top of the features 2, the height difference between the two, for example, is less than about 10 Å.

Although specific materials and formation methods are provided for the substrate 1, features 2, feature protection layer 3 and dielectric isolation layer 4/4', the materials may be replaced as long as they fulfill the requirements that the materials of the adjacent two are different and thus have a relatively high etch selectivity. For example, the feature protection layer 3 is formed of an oxide, and the dielectric isolation layer 4/4' is formed of a nitride; or the feature 2 is formed of an oxide, the feature protection layer 3 is formed of a nitride, and the dielectric isolation layer 4/4' is formed of an oxynitride, and so on.

According to the method for improving uniformity of chemical-mechanical planarization process of the invention, a dielectric isolation layer is formed again after grinding the dielectric isolation layer on the top of the features, which, on one hand, compensates for the recess of the dielectric layer between the features, and on the other hand, reduces the difference in height between the dielectric layer on the top of the features and the dielectric layer between the features, hence, after the second CMP planarization is carried out, the within-in-die uniformity may be improved.

Although the invention has been illustrated with reference to one or more exemplary embodiments, those skilled in the art may appreciate that various appropriate changes and equivalents may be made to the device structure without departing from the scope of the invention. Besides, many amendments that may be adapted to specific circumstances or materials may be made based on the disclosed teaching without departing from the scope of the invention. Therefore, the purpose of the invention is not limited to the specific embodiments that are disclosed as the best mode for carrying out the invention, instead, the is disclosed device structure and the manufacturing method thereof comprise all the embodiments that fall within the scope of the invention.

The invention claimed is:

1. A method for improving uniformity of chemical-mechanical planarization process, comprising the steps of:
    forming features on a substrate;
    forming a first dielectric isolation layer between the features;
    planarizing the first dielectric isolation layer until the features are exposed, causing the first dielectric isolation layer between the features to have a recess depth;
    increasing the recess depth of the first dielectric isolation layer by
    etching the first dielectric isolation layer;
    forming a second dielectric isolation layer on the features and the first dielectric isolation layer, whereby reducing the difference in height between the second dielectric isolation layer between the features and the second dielectric isolation layer on the top of the features; and
    planarizing the second dielectric isolation layer until the features are exposed.

2. The method according to claim 1, wherein the second dielectric isolation layer is of the same material as the first dielectric isolation layer.

3. The method according to claim 1, wherein the first dielectric isolation layer is etched by dry etching and/or wet etching.

4. The method according to claim 1, further comprising
    forming a feature protection layer on the top and sidewalls of the features,
    after forming the features and before forming the first dielectric isolation layer.

5. The method according to claim 1, wherein the features comprise one of the semiconductor material, insulating material and conductive material, wherein the semiconductor material comprises one of polycrystalline silicon, amorphous silicon and microcrystalline silicon, or combinations thereof, the insulating material comprises one of silicon oxide, silicon nitride, silicon oxynitride and high-k material, or combinations thereof, and the conductive material comprises one of the metal, metal alloy and metal nitride, or combinations thereof.

6. The method according to claim 1, wherein the first dielectric isolation layer and the second dielectric isolation layer comprise one of oxide, nitride and oxynitride, or combinations thereof.

7. The method according to claim 1, wherein when CMP planarization is employed, the grinding is automatically stopped by an endpoint detection system carried by the CMP device, or the grinding is stopped by controlling the grinding time.

8. The method according to claim 2, wherein the features comprise one of the semiconductor material, insulating material and conductive material, wherein the semiconductor material comprises one of polycrystalline silicon, amorphous silicon and microcrystalline silicon, or combinations thereof, the insulating material comprises one of silicon oxide, silicon nitride, silicon oxynitride and high-k material, or combinations thereof, and the conductive material comprises one of the metal, metal alloy and metal nitride, or combinations thereof.

9. The method according to claim 3, wherein the features comprise one the of semiconductor material, insulating material and conductive material, wherein the semiconductor material comprises one of polycrystalline silicon, amorphous silicon and microcrystalline silicon, or combinations thereof, the insulating material comprises one of silicon oxide, silicon nitride, silicon oxynitride and high-k material, or combinations thereof, and the conductive material comprises one of metal, metal alloy and metal nitride, or combinations thereof.

10. The method according to claim 4, wherein the features comprise one the of semiconductor material, insulating material and conductive material, wherein the semiconductor material comprises one of polycrystalline silicon, amorphous silicon and microcrystalline silicon, or combinations thereof, the insulating material comprises one of silicon oxide, silicon nitride, silicon oxynitride and high-k material, or combinations thereof, and the conductive material comprises one of the metal, metal alloy and metal nitride, or combinations thereof.

11. The method according to claim 2, wherein the first dielectric isolation layer and the second dielectric isolation layer comprise one of oxide, nitride and oxynitride, or combinations thereof.

12. The method according to claim 3, wherein the first dielectric isolation layer and the second dielectric isolation layer comprise one of oxide, nitride and oxynitride, or combinations thereof.

13. The method according to claim 4, wherein the first dielectric isolation layer, the second dielectric isolation layer and the feature protection layer comprise one of oxide, nitride and oxynitride, or combinations thereof.

14. The method according to claim 2, wherein when CMP planarization is employed, the grinding is automatically stopped by an endpoint detection system carried by the CMP device, or the grinding is stopped by controlling the grinding time.

15. The method according to claim 3, wherein when CMP planarization is employed, the grinding is automatically stopped by an endpoint detection system carried by the CMP device, or the grinding is stopped by controlling the grinding time.

16. The method according to claim 4, wherein when CMP planarization is employed, the grinding is automatically stopped by an endpoint detection system carried by the CMP device, or the grinding is stopped by controlling the grinding time.

17. The method according to claim 4, wherein the step of planarizing the first dielectric isolation layer further comprises
    planarizing the first dielectric isolation layer until the feature protection layer on the top of the features is exposed; and planarizing the feature protection layer on the top of the features until the features are exposed.

\* \* \* \* \*

UNITED STATES PATENT AND TRADEMARK OFFICE
CERTIFICATE OF CORRECTION

PATENT NO. : 8,647,987 B2  
APPLICATION NO. : 13/698283  
DATED : February 11, 2014  
INVENTOR(S) : Tao Yang et al.

Page 1 of 1

It is certified that error appears in the above-identified patent and that said Letters Patent is hereby corrected as shown below:

Title Page, item (75) should read:
YANG, Tao; ZHAO, Chao; LI, Junfeng; HOU, Ruibing; LU, Yihong; and CUI, Hushan.

Signed and Sealed this
Twenty-fourth Day of May, 2016

Michelle K. Lee
*Director of the United States Patent and Trademark Office*